United States Patent
Kang et al.

(10) Patent No.: US 7,796,441 B2
(45) Date of Patent: Sep. 14, 2010

(54) METHOD OF READING CONFIGURATION DATA IN FLASH MEMORY DEVICE

(75) Inventors: Sang-gu Kang, Suwon-si (KR); Young-ho Lim, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 188 days.

(21) Appl. No.: 12/052,922

(22) Filed: Mar. 21, 2008

(65) Prior Publication Data

US 2008/0298134 A1 Dec. 4, 2008

(30) Foreign Application Priority Data

May 29, 2007 (KR) .................. 10-2007-0052195

(51) Int. Cl.
*G11C 16/06* (2006.01)
(52) U.S. Cl. .................. 365/185.25; 365/185.21
(58) Field of Classification Search ............ 365/185.25
See application file for complete search history.

(56) References Cited

U.S. PATENT DOCUMENTS

| 7,042,776 | B2 | 5/2006 | Canada et al. |
| 7,495,955 | B2* | 2/2009 | Ido .................. 365/185.02 |
| 2005/0237842 | A1* | 10/2005 | Takeuchi et al. ......... 365/225.7 |

FOREIGN PATENT DOCUMENTS

| JP | 2004-246958 | 9/2004 |
| KR | 1020060089345 A | 8/2006 |

* cited by examiner

*Primary Examiner*—Hoai V Ho
*Assistant Examiner*—Anthan Tran
(74) *Attorney, Agent, or Firm*—Volentine & Whitt, P.L.L.C.

(57) ABSTRACT

Provided is a method of reading configuration data in a flash memory device, including a memory cell array which stores configuration data about an operating environment of the flash memory device. The method includes setting a read time of the configuration data to differ from a read time of normal data, and reading the configuration data.

18 Claims, 7 Drawing Sheets

METHOD OF READING CONFIGURATION DATA IN FLASH MEMORY DEVICE

CROSS-REFERENCE TO RELATED PATENT APPLICATION

A claim of priority is made to Korean Patent Application No. 10-2007-0052195, filed on May 29, 2007, the subject matter of which is hereby incorporated by reference.

BACKGROUND OF THE INVENTION

1. Field of the Invention

The present invention relates to a flash memory device, and more particularly, to a method of reading configuration data, which improves reliability of reading operations of a flash memory device.

2. Description of the Related Art

A flash memory is a nonvolatile memory device which can be electrically erased and reprogrammed. Flash memories have power consumption lower than that of a recording medium based on a magnetic disk memory, and an access time as fast as a hard disk of the magnetic disk memory.

Flash memory devices may be classified as NOR type flash memories or NAND type flash memories, in which cell transistors and bit lines are connected. In a NOR type flash memory device, at least two cell transistors are connected in parallel with a single bit line. The NOR type flash memory device stores data using a channel hot electron method and erases data using a Fowler-Nordheim (F-N) tunneling method. A NAND type flash memory device has at least two cell transistors serially connected to a single bit line. The NAND type flash memory device stores and erases data using the F-N tunneling method.

Generally, a NOR type flash memory consumes a lot of power, and thus cannot be highly integrated. However, a NOR type flash memory has a high operating speed. In contrast, a NAND type flash memory uses less cell current than a NOR type flash memory, and thus is suitable for high integration.

FIG. 1A is a circuit diagram of memory cells included in a conventional NAND type flash memory device. Referring to FIG. 1A, the conventional NAND type flash memory device includes memory cells M11, M12, M13 and M14, multiple wordlines WL11, WL12, WL3 and WL14, select transistors ST1 and ST2, and a bit line BL. The memory cells M11, M12, M13 and M14 form a string structure with the select transistors ST1 and ST2, and are connected in series between a bit line BL and a ground voltage VSS. The conventional NAND type flash memory uses a low cell current, and thus all the memory cells connected to a single wordline are programmed in one program operation.

FIG. 1B is a circuit diagram of a conventional NOR type flash memory. Referring to FIG. 1B, the conventional NOR type flash memory includes memory cells M21 through M26 connected between bit lines BL1 and BL2 and a source line CSL. The conventional NOR type flash memory consumes a lot of power and involves high current consumption while performing a program operation, and thus a the NOR type flash memory programs a predetermined number of memory cells through a one-time programming operation A flash memory also can be classified into a single-level cell (SLC) flash memory or a multi-level cell (MLC) flash memory based on the number of bits stored in one memory cell. An SLC flash memory is used to store one bit of data in one memory cell, while an MLC flash memory is used to store two bits of data in one memory cell in order to increase the degree of integration.

FIG. 2A is a graph illustrating cell threshold voltages in relation to stored data when the memory cells M11 through M14 of FIG. 1A or the memory cells M21 through M26 of FIG. 1B are SLCs. FIG. 2B is a graph illustrating cell threshold voltages in relation to stored data when the memory cells M11 through M14 of FIG. 1A or the memory cells M21 through M26 of FIG. 1B are MLCs.

Referring to FIG. 2A, the SLC stores one bit of data according to two different threshold voltage ranges programmed in a memory cell. For example, when the threshold voltage programmed in a memory cell is 1 through 3 volts, data stored in the memory cell is logic "1, " and when a threshold voltage programmed in a memory cell is 5 through 7 volts, data stored in the memory cell is logic "0."

Referring to FIG. 2B, the MLC stores two bits of data according to four different threshold voltage ranges programmed in a memory cell. For example, when a threshold voltage programmed in a memory cell is 1 through 3 volts, data stored in the memory cell is logic "11," and when a threshold voltage programmed in a memory cell is 3.8 through 4.2 volts, data stored in the memory cell is logic "10." Also, when a threshold voltage programmed in a memory cell is 4.9 through 5.4 volts, data stored in the memory cell is logic "01," and when a threshold voltage programmed in a memory cell is 6.5 through 7.0 volts, data stored in the memory cell is logic "00."

Regarding a flash memory employing an SLC or an MLC, data stored in a memory cell is classified according to cell current during a read operation. Operations of SLC and MLC flash memories are apparent to one of ordinary skill in the art, and thus detailed descriptions thereof are not included.

Generally, various types of information required in operating a memory should be included in a memory device. For example, an electrical fuse (E-Fuse) method is a method of storing the various types of information in a memory cell instead of a conventional laser fuse, reading the information when a memory chip operates, turning ON/OFF a corresponding switch, and sending the information. Information stored in an E-Fuse form may include DC trim information for operating a memory chip, option information, repair and bad block information, and the like. Such information for operating the memory chip is pre-stored while testing a certain area of a memory cell.

When power is applied to a memory chip, the above information is stored in a latch of the memory chip through a data reading process, and the corresponding switch is turned ON/OFF using the stored information. Various DC level values are set up using the information for operating a memory, and defect columns and defect blocks can be repaired.

However, configuration data stored in E-Fuse form (hereinafter, referred to as E-Fuse data) may not be reliable, because the configuration data cannot use the DC trim information and is read using a DC level setup as a default. A read voltage has a predetermined DC level between each state of FIG. 2, and a memory cell that has a threshold voltage lower than the predetermined DC level is turned ON. Conversely, a memory cell that has a threshold voltage higher than the predetermined DC level is turned OFF. Accordingly, the E-Fuse data may be incorrectly read based on changes of the default DC level due to process variations.

The E-Fuse data may also be incorrectly read due to a read disturb phenomenon that may occur when repeatedly reading the E-Fuse data. In the read disturb phenomenon, data that is to be read is affected by high voltage applied to non-selected word lines while reading the data.

Accordingly, when E-Fuse data related to operating a memory is read, an error may occur due to a change of an operating environment of a memory device. Thus, reading operations of the E-Fuse data may be unreliable and cannot be guaranteed.

SUMMARY OF THE INVENTION

The present invention provides a flash memory device and a method of storing configuration data of the flash memory device, which can improve reliability of reading operations of the configuration data, e.g., stored in an E-Fuse form.

According to an aspect of the present invention, there is provided a method of reading configuration data regarding to an operating environment of a flash memory device. The flash memory device includes a memory cell array which stores the configuration data. The method includes setting a read time of the configuration data to differ from a read time of normal data, and reading the configuration data.

The configuration data may include DC trim information for operating the flash memory device, option information, repair information and bad block information.

The read time of the configuration data may be longer than the read time of the normal data. Also, setting the read time of the configuration data may include regulating the read time of the configuration data based on the read time of the normal data.

The read time of each of the normal data and the configuration data may include a page buffer reset time, a bit line precharge time, a bit line develop time, and a sensing time.

Setting the read time of the configuration data may include regulating the bit line precharge time of the configuration data. The difference between the read time of the configuration data and the read time of the normal data may equal a difference between the bit line precharge time of the configuration data and the bit line precharge time of the normal data.

Setting the read time of the configuration data may include regulating the bit line develop time of the configuration data. The difference between the read time of the configuration data and the read time of the normal data may equal a difference between the bit line develop time of the configuration data and the bit line develop time of the normal data.

Setting the read time of the configuration data may include regulating the bit line precharge time and the bit line develop time of the configuration data. Setting the read time of the configuration data may also include setting the bit line precharge time and the bit line develop time of the configuration data to be different from the bit line precharge time and the bit line develop time of the normal data. The difference between a sum of the bit line precharge time and the bit line develop time of the configuration data and a sum of the bit line precharge time and the bit line develop time of the normal data equal a difference between the read time of the configuration data and the read time of the normal data.

Setting the read time of the configuration data may include regulating the page buffer reset time, the bit line precharge time, the bit line develop time and the sensing time of the configuration data. Setting of the read time of the configuration data may also include setting the bit line develop time and the sensing time of the configuration data to differ from the bit line develop time and the sensing time of the normal data. The difference between a sum of the bit line develop time and the sensing time of the configuration data and a sum of the bit line develop time and the sensing time of the normal data may equal a difference between the read time of the configuration data and the read time of the normal data.

The read time of the configuration data may be shorter than the read time of the normal data. Also, the configuration data may be read using a read voltage having a ground level, or a read voltage of 1 V.

According to another aspect of the present invention, there is provided a flash memory device, including a memory cell array, a control circuit and a data output unit. The memory cell array stores configuration data related to an operating environment of the flash memory device. The control circuit generates a control signal that controls reading of the configuration data. The data output unit outputs the configuration data in response to the control signal. The control circuit generates the control signal by differentiating a read time of the configuration data and a read time of normal data.

BRIEF DESCRIPTION OF THE DRAWINGS

The embodiments of the present invention will be described with reference to the attached drawings, in which.

DETAILED DESCRIPTION OF THE EMBODIMENTS

Figure 1A:
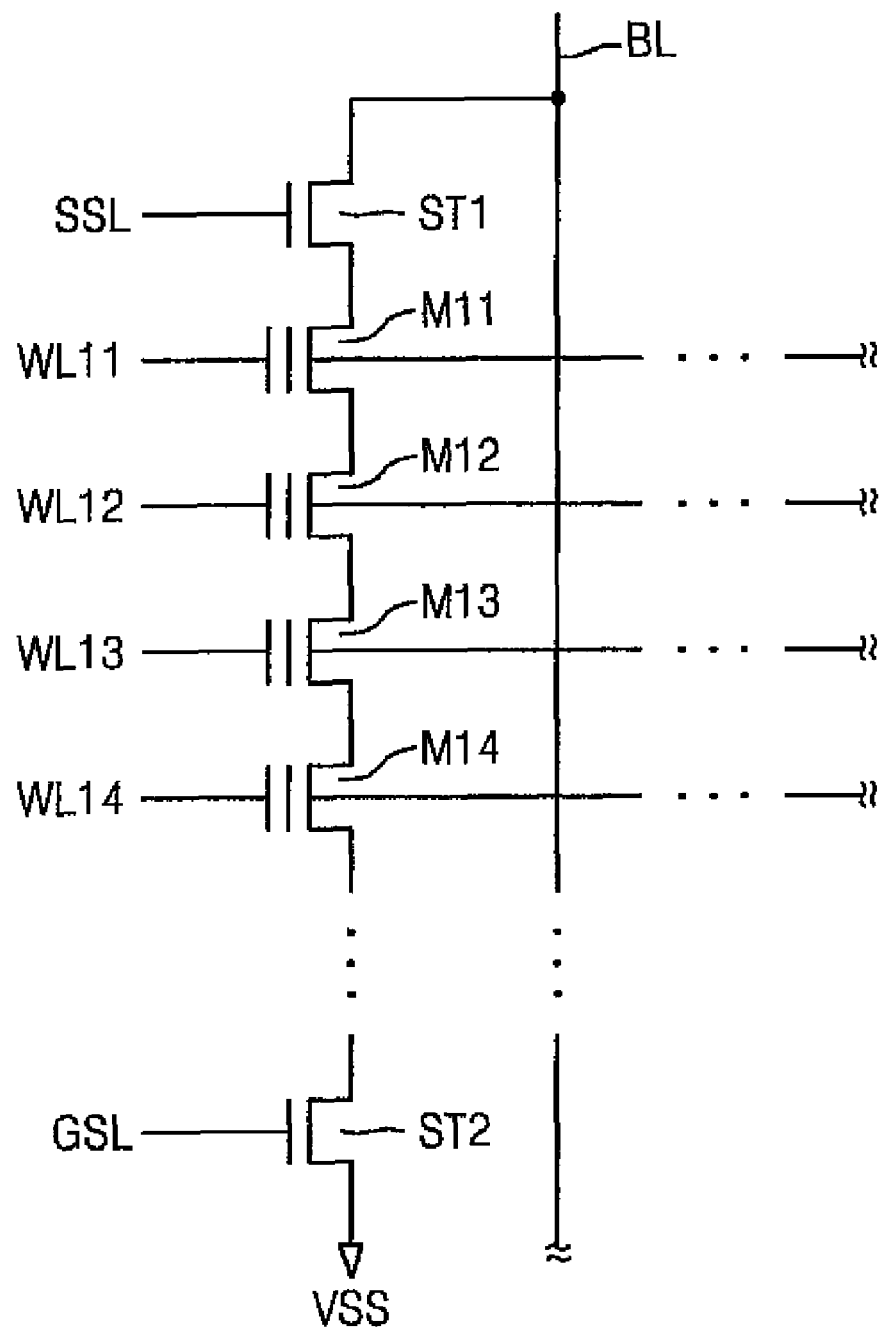
FIG. 1A is a circuit diagram of a conventional NAND type flash memory.

The present invention will now be described more fully with reference to the accompanying drawings, in which exemplary embodiments of the present invention are shown. The invention may, however, be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 3:
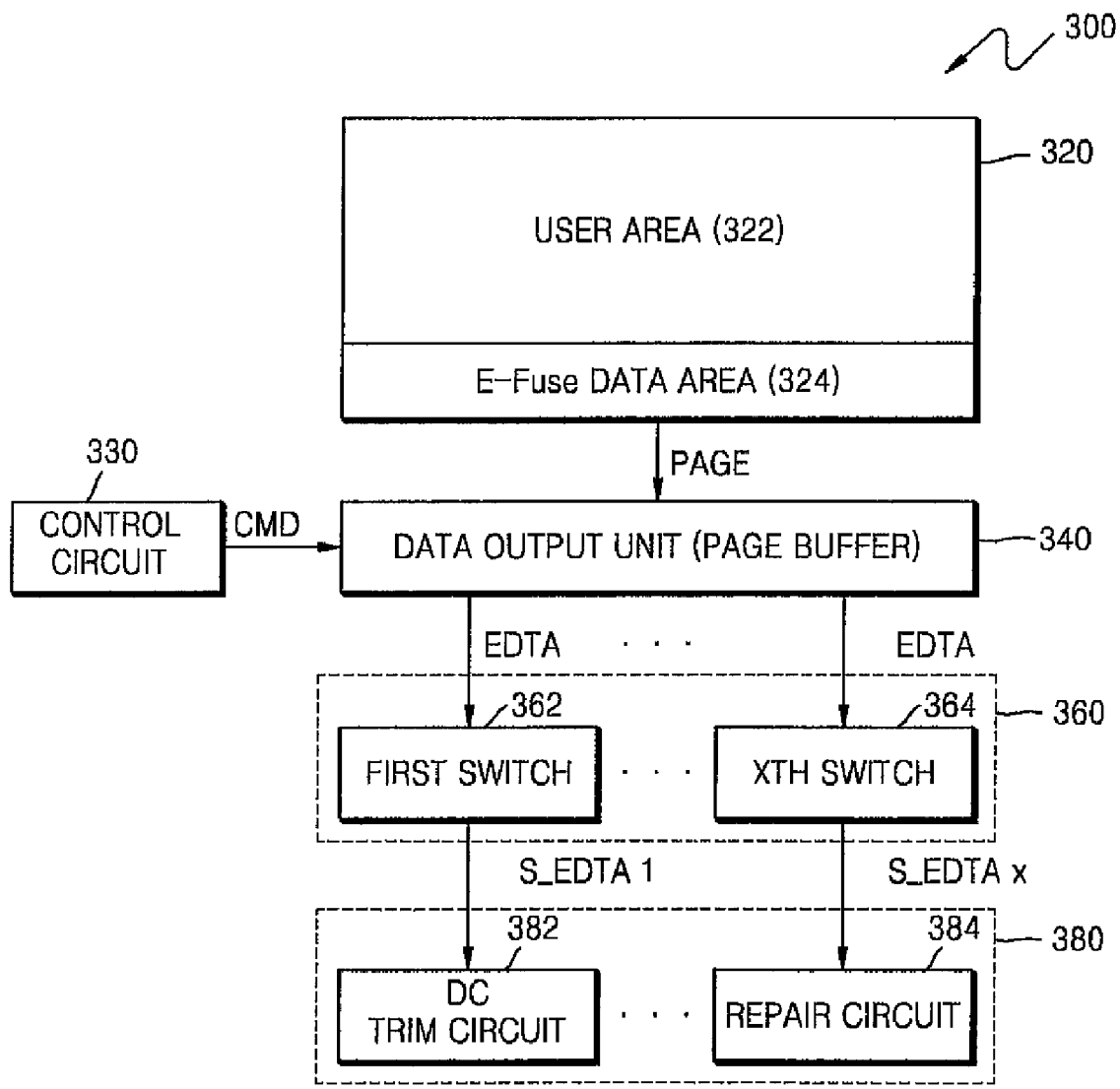
FIG. 3 is a block diagram illustrating a flash memory device, according to an exemplary embodiment of the present invention.

FIG. 3 is a block diagram illustrating a basic structure of a flash memory device 300 according to an illustrative embodiment of the present invention.

Referring to FIG. 3, the flash memory device 300 includes a memory cell array 320, a control circuit 330, a data output unit 340, a switch unit 360 and a trim/repair circuit 380, which includes a DC trim circuit 382 and a repair circuit 384. The memory cell array 320 may include a user area 322 and an electrical fuse (E-Fuse) data area 324. The user area 322 stores user data or the like, and the E-Fuse data area 324 stores E-Fuse data EDTA.

Hereinafter, for purposes of explanation, only memory operations regarding the E-Fuse data EDTA will be described. The E-Fuse data EDTA refers to configuration data required in operating the flash memory device 300. The E-Fuse data EDTA may include DC trim information, option information, repair information, bad block information, etc.

The control circuit 330 generates a control signal CMD which controls reading of the E-Fuse data EDTA. In the depicted embodiment, the control circuit 330 of the flash memory device 300 generates the control signal CMD, for example, by differentiating a read time of the E-Fuse data EDTA and a read time of normal data. The normal data (e.g., non-E-Fuse data) may include user data, for example, described above with respect to the user area 322.

Referring to FIG. 3, the data output unit 340 outputs the E-Fuse data EDTA in response to the control signal CMD. The data output unit 340 may be a page buffer, for example, which may include a sensing circuit (not shown) and a latch circuit (not shown).

More specifically, the data output unit 340 of the flash memory device 300 outputs the E-Fuse data EDTA according to a read time different from the read time of the normal data. Operations of generating a control signal by differentiating the read time of the E-Fuse data and the read time of the normal data, and accordingly outputting the E-Fuse data, will be described below with respect to a method of reading E-Fuse data.

Figure 4:
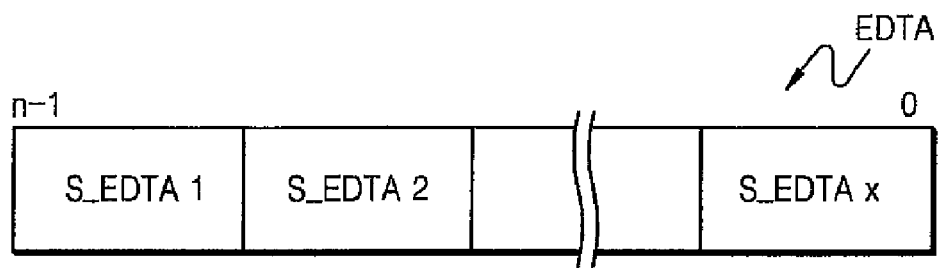
FIG. 4 is a diagram illustrating electrical fuse (E-Fuse) data of FIG. 3, according to an exemplary embodiment of the present invention.

FIG. 4 is a diagram illustrating an example of a basic structure of the E-Fuse data EDTA of FIG. 3, according to an illustrative embodiment of the present invention.

Referring to FIG. 4, the E-Fuse data EDTA includes multiple pieces of information regarding an operating environment of the flash memory device 300. For example, a predetermined number of upper bits S_EDTA1 from among n bits of the E-Fuse data EDTA may store DC trim information, a predetermined number of intermediate bits S_EDTA2 may store option information, and a predetermined number of lower bits S_EDTAx may store repair information.

A process of setting up an operating environment of the flash memory device 300 of FIG. 3 using the E-Fuse data EDTA will now be described. Referring again to FIG. 3, when power is applied to the flash memory device 300, an initial read operation for the E-Fuse data EDTA stored in the E-Fuse data area 324 is performed.

When a read voltage for the E-Fuse data EDTA is applied to the E-Fuse data area 324, a corresponding page PAGE is transmitted to the data output unit (e.g., page buffer) 340. Data corresponding to a corresponding IO from among bit values stored in the data output unit 340 is provided to the switch unit 360 as the E-Fuse data EDTA. First and xth switches 362 and 364 of the switch unit 360 control the ON/OFF status of the DC trim circuit 382 according to DC trim information S_EDTA1 of the E-Fuse data EDTA, and the ON/OFF status of the repair circuit 384 according to repair information S_EDTAx of the E-Fuse data EDTA, respectively.

Figure 5:
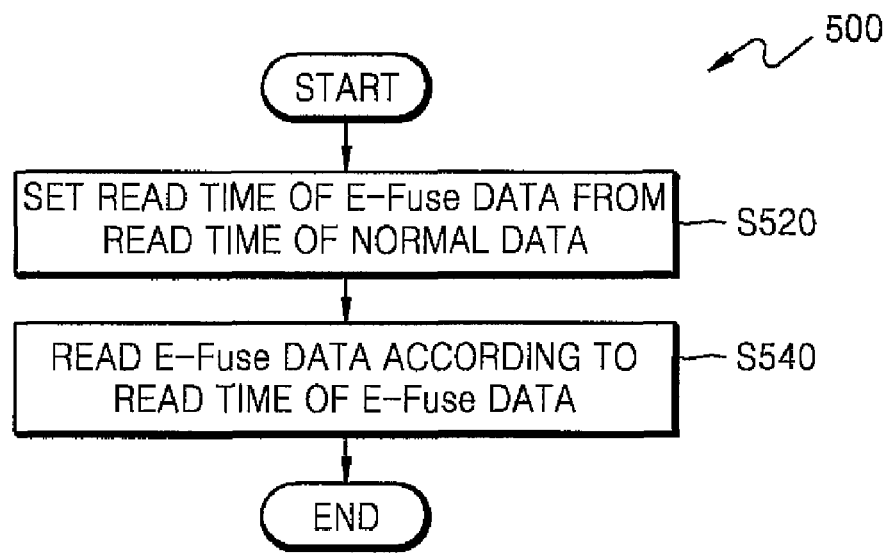
FIG. 5 is a flowchart illustrating a method of reading E-Fuse data, according to an exemplary embodiment of the present invention.

FIG. 5 is a flowchart illustrating a method 500 of reading E-Fuse data, according to an illustrative embodiment of the present invention.

Referring to FIG. 5, the method 500 of reading E-Fuse data according to the depicted embodiment includes operation 520, which sets a read time of E-Fuse data to be different from a read time of normal data, and operation 540, which reads the E-Fuse data according to the read time of the E-Fuse data. The read time of the E-Fuse data may be longer or shorter than the read time of the normal data. However, for purposes of explanation, the following descriptions are directed to the read time of the E-Fuse data being longer than the read time of the normal data.

Figure 6:
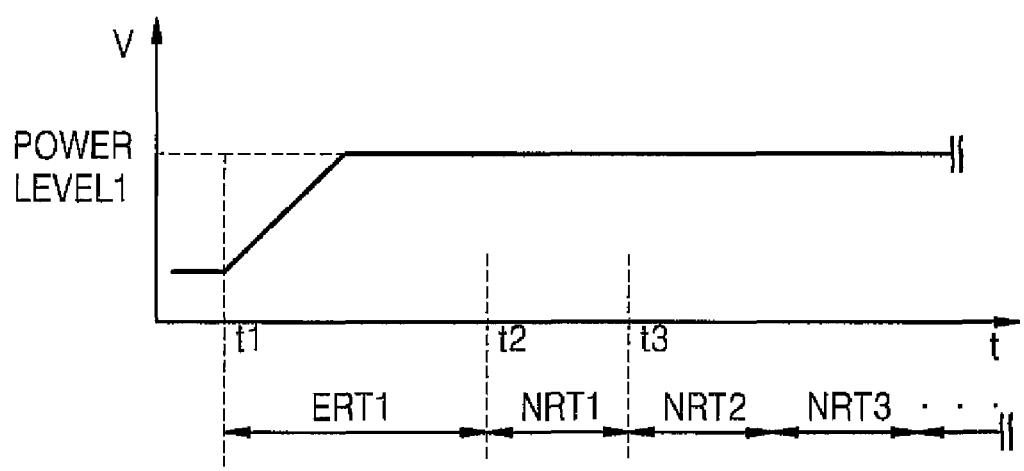
FIG. 6 is a graph conceptually illustrating setting read time of E-Fuse data.

FIG. 6 is a graph conceptually illustrating a process of setting a read time of E-Fuse data to be different from a read time of normal data, according to an illustrative embodiment of the present invention.

Referring to FIG. 6, when power is applied (t1) to the flash memory device 300 of FIG. 3, the E-Fuse data is read for read time ERT1 (t2-t1). When the read operation of the E-Fuse data is completed (t2), a read operation of the normal data may be performed for read time NRT1 (t3-t2). In the depicted example, the method 500 sets the read time ERT1 of the E-Fuse data to be longer than the read time NRT1 of the normal data.

Figure 7:
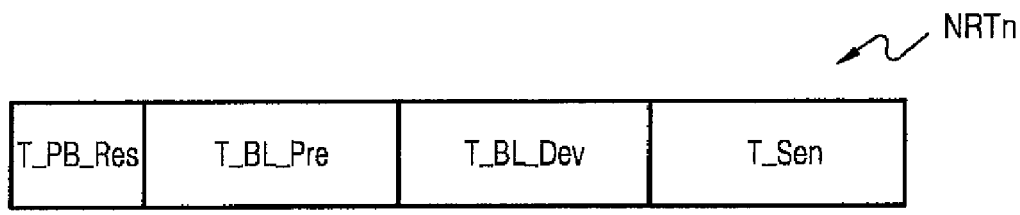
FIG. 7 is a diagram conceptually illustrating read time of normal data.

FIG. 7 is a diagram conceptually illustrating a conventional read time NRTn of normal data.

Referring to FIG. 7, the read time NRTn of the normal data includes a page buffer reset time T_PB_Res, a bit line precharge time T_BL_Pre, a bit line develop time T_BL_Dev, and a sensing time T_Sen. Generally, in order to read data, the data output unit 340 of FIG. 3 is reset. The time taken to reset the data output unit 340 is the page buffer reset time T_PB_Res. Then, the bit line BL (e.g., of FIG. 1A) is precharged. The time taken to precharge the bit line BL is the bit line precharge time T_BL_Pre.

Figure 1B:
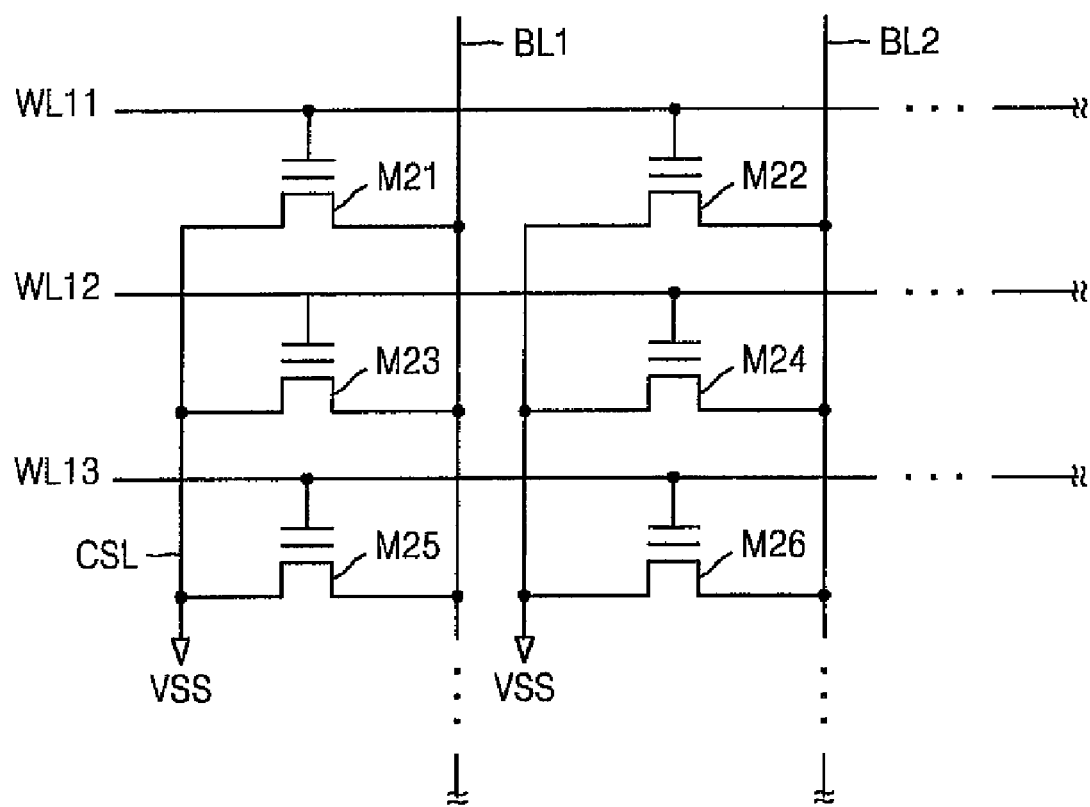
FIG. 1B is a circuit diagram of a conventional NOR type flash memory.
Figure 2A:
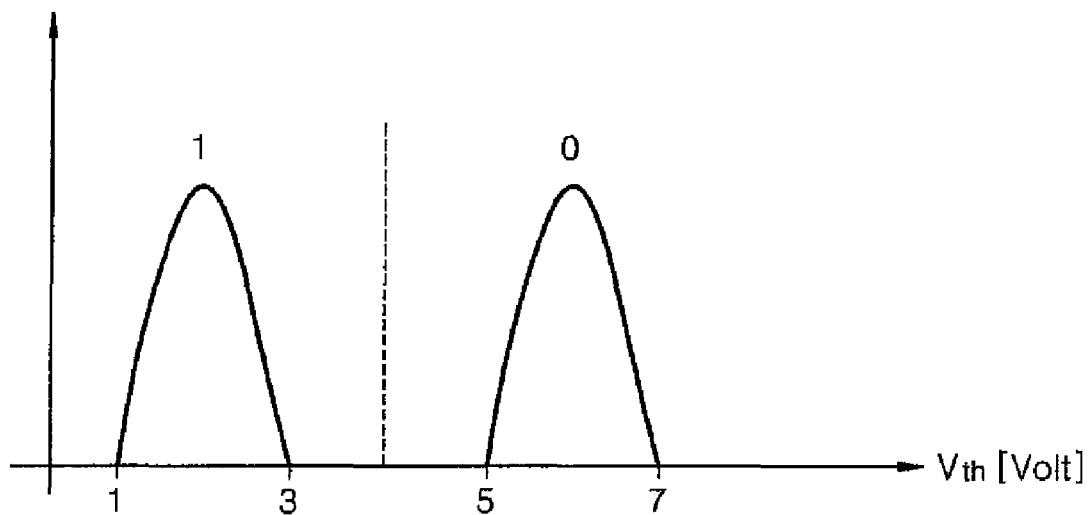
FIG. 2A is a graph illustrating cell threshold voltages and storage data of conventional single-level cells (SLCs)
Figure 2B:
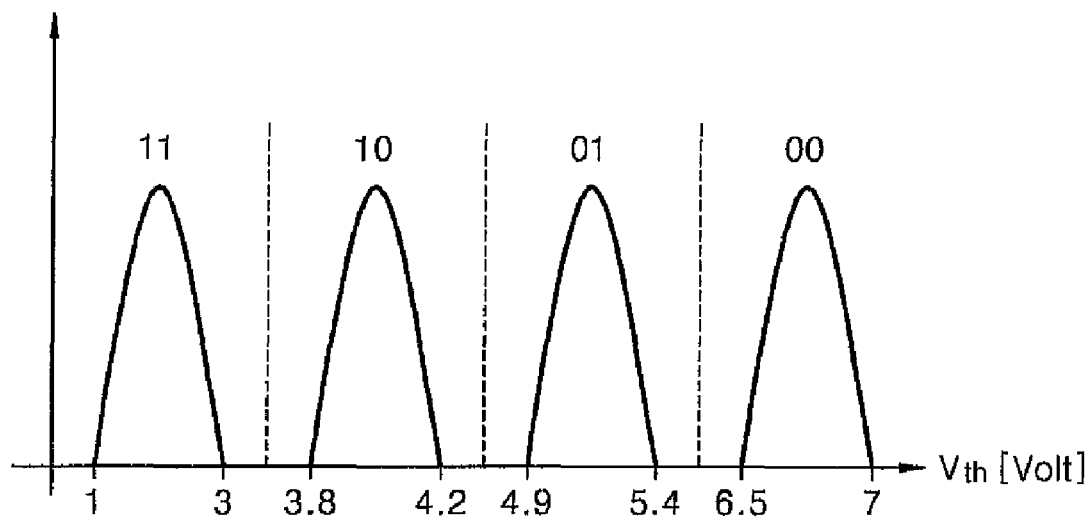
FIG. 2B is a graph illustrating cell threshold voltages and storage data of conventional multi-level cells (MLCs)

When the bit line BL is precharged, a high voltage is applied to unselected word lines and a low voltage is applied to selected word lines, so that a read operation can be performed. In the case of an SLC flash memory, the high voltage is approximately 6 V and the low voltage is 0 V. When a voltage corresponding to the word lines (e.g., word lines WL11 through WL14 of FIG. 1) is applied, the flash memory device 300 of FIG. 3 performs a bit line develop operation. The time taken to perform the bit line develop operation is the bit line develop time T_BL_Dev.

When a memory cell connected to the selected word lines is an ON cell during the bit line develop time T_BL_Dev, a bit line connected to the ON cell decreases to a low level. When the memory cell is an OFF cell during the bit line develop time T_BL_Dev, the bit line maintains a precharge level. Generally, in the case of an SLC flash memory, the SLC flash memory is turned ON because a threshold voltage of a memory cell in an erase state is lower than a read voltage. Accordingly, the ON cell corresponds to a memory cell in an erase state and the OFF cell corresponds to a memory cell in a program state.

The sensing circuit of the data output unit 340 of FIG. 3 checks whether the corresponding memory cell is an ON cell or an OFF cell by detecting a voltage level of the bit line BL. The time taken to check whether the memory cell is an ON cell or an OFF cell is the sensing time T_Sen, as shown in FIG. 7.

Figure 8A:
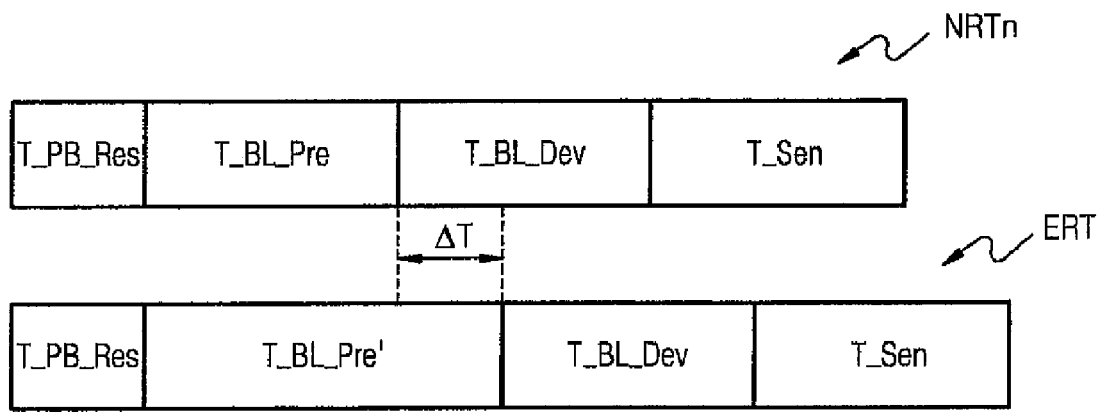
FIGS. 8A and 8B are diagrams conceptually illustrating regulating read time of E-Fuse data, according to an exemplary embodiment of the present invention.
Figure 8B:
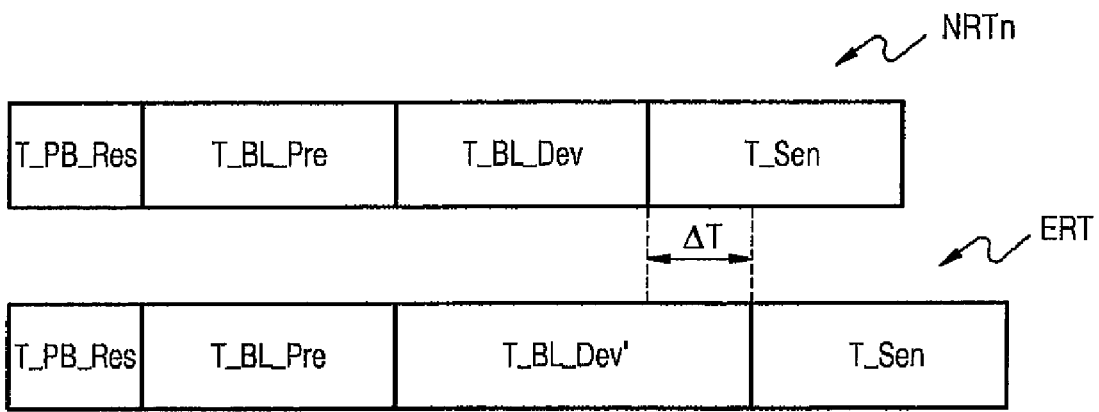

FIGS. 8A and 8B are diagrams conceptually illustrating a process of regulating a read time ERT of E-Fuse data, according to an illustrative embodiment of the present invention. FIGS. 8A and 8B show exemplary structures of read time NRTn of normal data and read time ERT of E-Fuse data. Referring to FIGS. 8A and 8B, the read time ERT of the E-Fuse data includes a page buffer reset time T_PB_Res, a bit line precharge time T_BL_Pre or T_BL_Pre', a bit line develop time T_BL_Dev or T_BL_Dev', and a sensing time T_Sen.

Referring to FIGS. 5, 8A and 8B, using the method 500 of reading E-Fuse data, the read time ERT of the E-Fuse data can be set based on changing the read time NRTn of the normal data. More particularly, FIG. 8A illustrates a case in which the read time ERT of the E-Fuse data is set by regulating a bit line precharge time T_BL_Pre' based on a bit line precharge time T_BL_Pre of the read time NRTn of the normal data plus an additional time. FIG. 8B illustrates a case in which the read time ERT of the E-Fuse data is set by regulating a bit line develop time T_BL_Dev' based on a bit line develop time T_BL_Dev of the read time NRTn of the normal data plus an additional time.

In FIG. 8A, the bit line precharge time T_BL_Pre' of the read time ERT of the E-Fuse data is set to equal the bit line precharge time T_BL_Pre of the read time NRTn of the normal data, extended by an additional time, indicated by the difference ΔT between the read time ERT of the E-Fuse data and the read time NRTn of the normal data. Similarly, in FIG. 8B, the bit line develop time T_BL_Dev' of the read time ERT of the E-Fuse data is set equal to the bit line develop time T_BL_Dev of the read time NRTn of the normal data, extended by an additional time, indicated by the difference ΔT between the read time ERT of the E-Fuse data and the read time NRTn of the normal data.

It is understood that methods of setting the read time ERT of the E-Fuse data by regulating read time ERT based on the read time NRTn of the normal data are not limited to the procedures illustrated in FIGS. 8A and 8B. For example, the read time ERT of the E-Fuse data can be set by extending (or reducing) the page buffer reset time T_PB_Res, the bit line precharge time T_BL_Pre, the bit line develop time T_BL_Dev, and/or the sensing time T_Sen. Regardless of the method, the sum of the extended time should be equal to the difference .DELTA.T between the read time ERT of the E-Fuse data and the read time NRTn of the normal data.

Figure 9:
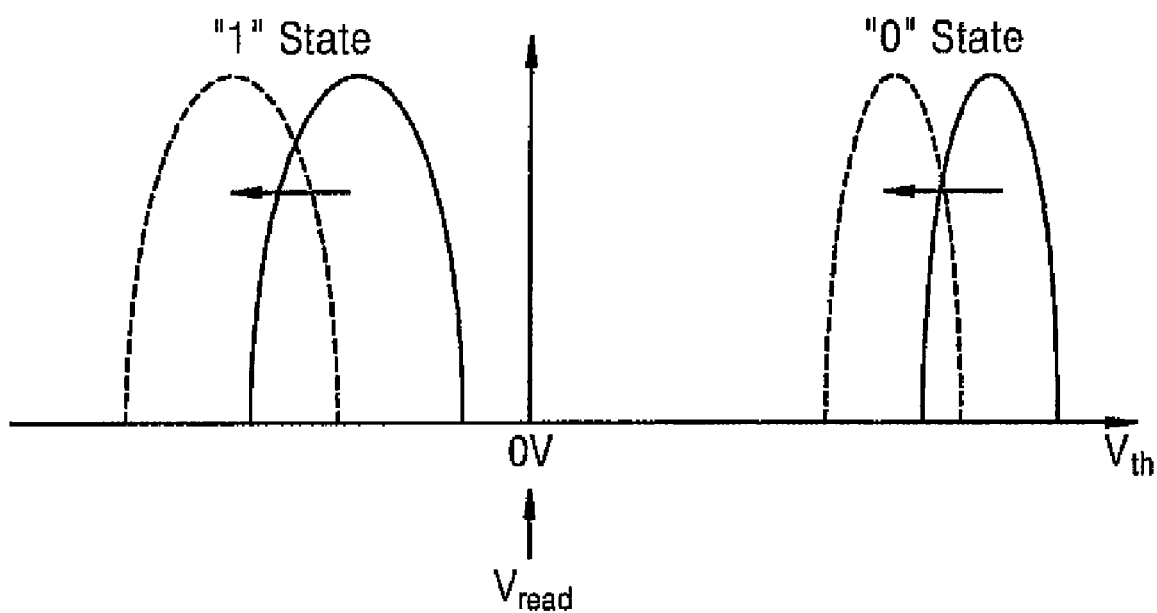
FIG. 9 is a graph illustrating changes of margins of ON cell and OFF cell according to increased read time of E-Fuse data, according to an exemplary embodiment of the present invention.

FIG. 9 is a graph illustrating margin changes of an ON cell and an OFF cell corresponding to an increase of a read time of E-Fuse data, according to an illustrative embodiment of the present invention.

Referring to FIG. 9, by increasing the read time of the E-Fuse data, a distribution of a physical threshold voltage of the memory cells is transformed from the solid line curve to the dotted line curve. This is because more current is supplied to the ON cell as the read time of the E-Fuse data increases, and thus a voltage level of a bit line of the ON cell decreases.

Accordingly, the sensing circuit included in the data output unit 340 of FIG. 3 is able to more accurately recognize the difference between the ON cell and the OFF cell. In other words, the method of reading E-Fuse data according to the various embodiments increases the margin between the program state and the erase state.

Further, a read voltage Vread of the E-Fuse data may be set to a ground voltage. When the read voltage Vread is a ground voltage, a process variation effect does not occur. Also, a read disturb phenomenon, which may occur while reading the E-Fuse data, can be prevented. However, it is understood that the method of reading E-Fuse data according to various embodiments of the invention is not limited to the read voltage Vread of the E-Fuse data being set a ground voltage. Alternatively, the read voltage Vread and may be a low voltage of around 1 V, which can prevent DC level changes due to process variations and the read disturb phenomenon.

As described above, using the method of reading E-Fuse data in the flash memory device according to embodiments of the present invention, the E-Fuse data may be reliably read by setting the read voltage to a low level, thereby reducing or eliminating the possibilities of changes in a DC level due to process variation and the read disturb phenomenon. Also, the read time of the E-Fuse data may be increased so as to sufficiently obtain a margin between an ON cell and an OFF cell.

Accordingly, using the method of reading E-Fuse data in a flash memory device according to embodiments of the present invention, the E-Fuse data can be reliably read by setting the read voltage to a low level and increasing the read time of the E_Fuse data.

While the present invention has been particularly shown and described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of reading configuration data related to an operating environment of a flash memory device, the flash memory device comprising a memory cell array which stores the configuration data, the method comprising:

setting a read time of the configuration data to differ from a read time of normal data; and reading the configuration data wherein the read time of the configuration data and the read time of the normal data each comprises at least one of a page buffer reset time, a bit line precharge time, a bit line develop time and a sensing time, wherein the read time of the configuration data further comprises an additional time by regulating at least one of the page buffer reset time, the bit line precharge time, the bit line develop time and the sensing time of the configuration data, and wherein the read time of the configuration data differs from the read time of the normal data by as much as the additional time of the configuration data.

2. The method of claim 1, wherein the configuration data comprises DC trim information for operating the flash memory device, option information, repair information and bad block information.

3. The method of claim 1, wherein the read time of the configuration data is longer than the read time of the normal data.

4. The method of claim 1, wherein setting the read time of the configuration data comprises regulating the read time of the configuration data based on the read time of the normal data.

5. The method of claim 1, wherein setting the read time of the configuration data comprises regulating the bit line precharge time of the configuration data.

6. The method of claim 5, wherein the additional time of the configuration data equals a difference between the bit line precharge time of the configuration data and the bit line precharge time of the normal data.

7. The method of claim 1, wherein the setting the read time of the configuration data comprises regulating the bit line develop time of the configuration data.

8. The method of claim 7, wherein the additional time of the configuration data equals a difference between the bit line develop time of the configuration data and the bit line develop time of the normal data.

9. The method of claim 1, wherein setting the read time of the configuration data comprises regulating the bit line precharge time and the bit line develop time of the configuration data.

10. The method of claim 9, wherein setting the read time of the configuration data comprises setting the bit line precharge time and the bit line develop time of the configuration data to be different from the bit line precharge time and the bit line develop time of the normal data, the difference between a sum of the bit line precharge time and the bit line develop time of the configuration data and a sum of the bit line precharge time and the bit line develop time of the normal data equaling the additional time of the configuration data.

11. The method of claim 1, wherein setting the read time of the configuration data comprises regulating the page buffer reset time, the bit line precharge time, the bit line develop time and the sensing time of the configuration data.

12. The method of claim 11, wherein setting of the read time of the configuration data comprises setting the bit line develop time and the sensing time of the configuration data to differ from the bit line develop time and the sensing time of the normal data, the difference between a sum of the bit line develop time and the sensing time of the configuration data and a sum of the bit line develop time and the sensing time of the normal data equaling the additional time of the configuration data.

13. The method of claim 1, wherein the read time of the configuration data is shorter than the read time of the normal data.

14. The method of claim 1, wherein the configuration data is read using a read voltage having a ground level.

15. The method of claim 1, wherein the configuration data is read using a read voltage of 1 V.

16. A flash memory device, comprising:
a memory cell array which stores configuration data related to an operating environment of the flash memory device;
a control circuit which generates a control signal that controls reading of the configuration data; and
a data output unit which outputs the configuration data in response to the control signal,
wherein the control circuit generates the control signal by differentiating a read time of the configuration data and a read time of normal data,
wherein the read time of each of the normal data and the configuration data comprises at least one of a page buffer reset time, a bit line precharge time, a bit line develop time and a sensing time,
wherein the read time of the configuration data further comprises an additional time by regulating at least one of the page buffer reset time, the bit line precharge time, the bit line develop time and the sensing time of the configuration data, and
wherein the read time of the configuration data differs from the read time of the normal data by as much as the additional time of the configuration data.

17. The flash memory device of claim 16, wherein the configuration data comprises DC trim information for operating the flash memory device, option information, repair information and bad block information.

18. The flash memory device of claim 16, wherein the read time of the configuration data is set by regulating at least one of the page buffer reset time, the bit line precharge time, the bit line develop time and the sensing time of the configuration data.

* * * * *